(12) United States Patent
Jeng et al.

(10) Patent No.: US 6,277,658 B1
(45) Date of Patent: Aug. 21, 2001

(54) METHOD FOR MONITORING ALIGNMENT MARK SHIELDING

(75) Inventors: Shwangming Jeng; Jeng-Horng Chen; Chen-Hua Yu, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/282,059

(22) Filed: Mar. 29, 1999

(51) Int. Cl.[7] ...................................................... H01L 21/66
(52) U.S. Cl. ............................ 438/14; 118/721; 257/797; 438/401
(58) Field of Search ............................ 257/797; 438/975, 438/FOR 495, 14, 401, 462; 118/721; 204/298.02

(56) References Cited

U.S. PATENT DOCUMENTS

| | | | |
|---|---|---|---|
| 4,592,308 | * 6/1986 | Shih et al. ............................. | 118/726 |
| 4,599,970 | * 7/1986 | Peterson ................................ | 118/504 |
| 5,118,742 | * 6/1992 | Burkhardt et al. ..................... | 524/266 |
| 5,320,728 | 6/1994 | Tepman ............................. | 204/192.12 |
| 5,456,756 | 10/1995 | Ramaswami et al. ................ | 118/721 |
| 5,525,840 | * 6/1996 | Tominaga .............................. | 257/797 |
| 5,614,446 | 3/1997 | Ramaswami et al. ................ | 437/228 |
| 5,877,036 | * 3/1999 | Kawai ..................................... | 438/16 |
| 6,120,607 | * 9/2000 | Taravade ............................... | 118/720 |

* cited by examiner

Primary Examiner—Olik Chaudhuri
Assistant Examiner—Marcos D. Pizarro-Crespo
(74) Attorney, Agent, or Firm—George O. Saile; Stephen B. Ackerman; Larry J. Prescott

(57) ABSTRACT

A method of using a monitor wafer to monitor the shielding of alignment marks during material deposition steps. The alignment marks are shielded using shielding tabs attached to the clamp ring used to clamp the wafer during deposition of a layer of material. An oxide monitor wafer, having the same size and shape of product wafers, has monitor marks formed thereon. The center of the monitor marks has the same location on the monitor wafer as the alignment marks have on the product wafers. The monitor wafer is subjected to the same processing steps as the product wafers through the step of material deposition. The clamp ring is removed from the monitor wafer and the distance from the center of the monitor marks and the edge of the deposited material is determined. The monitor marks are formed so that the distance from the center of the monitor marks and the edge of the deposited material can be determined by direct observation of the monitor marks. The monitor wafers are processed after adjustments to or maintenance on equipment or after a fixed number of product wafers are processed.

20 Claims, 6 Drawing Sheets

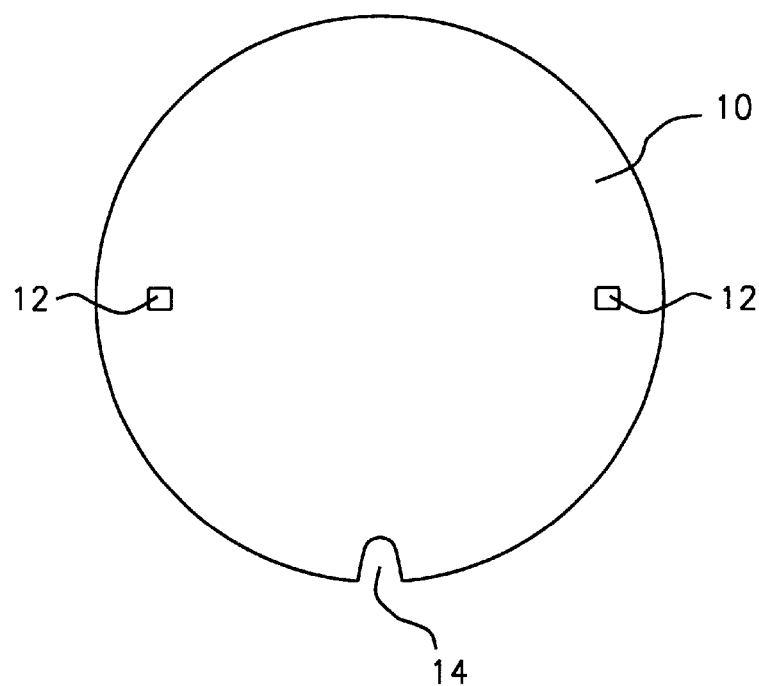
FIG. 1 - Prior Art
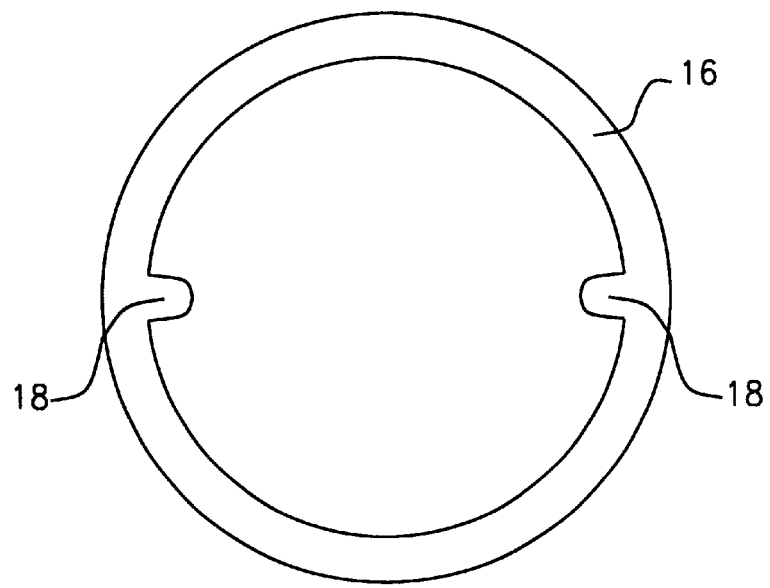
FIG. 2 - Prior Art

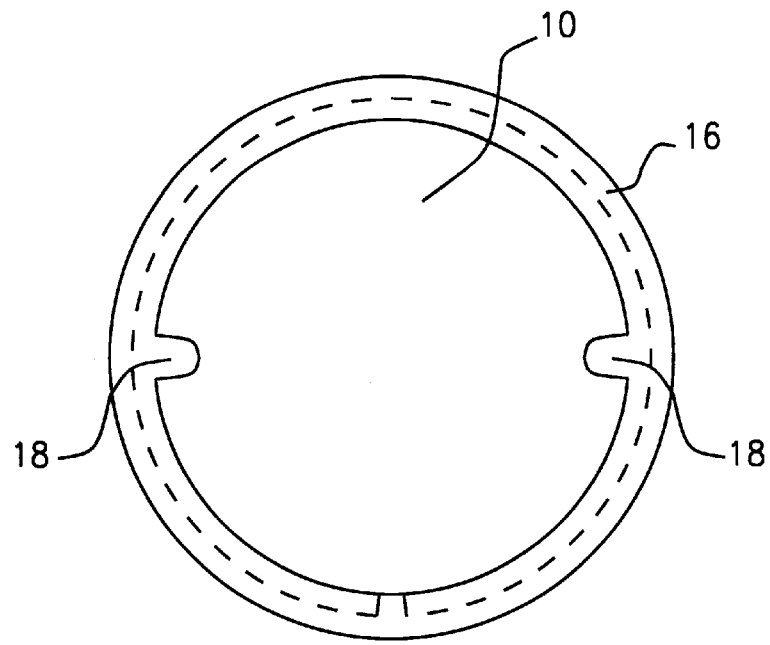
FIG. 3 - Prior Art
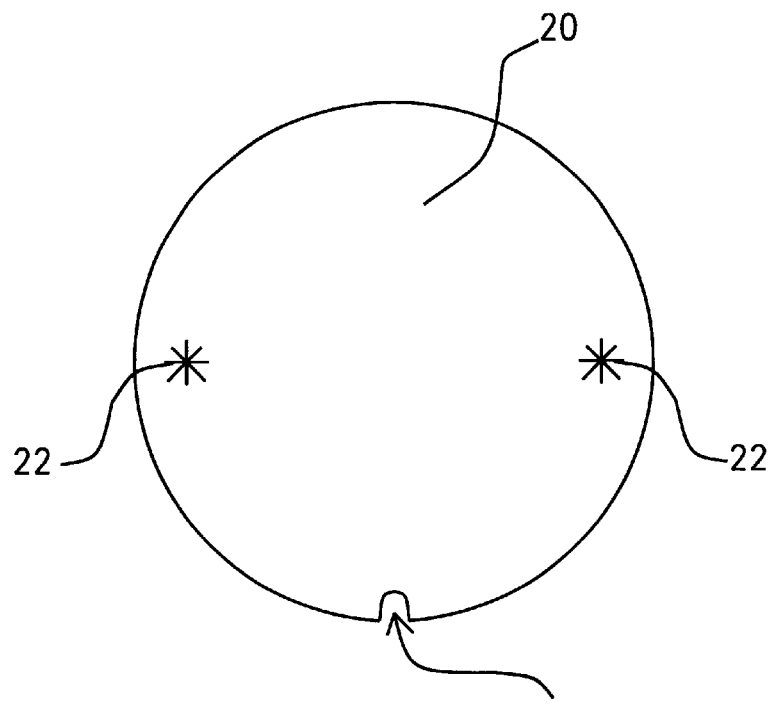
FIG. 4A

METHOD FOR MONITORING ALIGNMENT MARK SHIELDING

BACKGROUND OF THE INVENTION (1) Field of the Invention

This invention relates to a monitor wafer and method used to monitor the use of clamp ring shielding tabs to preserve alignment marks by shielding the alignment marks during deposition of material on a wafer.

(2) Description of the Related Art

The preservation of alignment marks after the deposition of layers of material on a wafer is of primary importance in photolithographic processing of integrated circuit wafers. One method used to preserve the alignment marks is to place shielding tabs on the clamp rings used to hold the wafer in place during material deposition. The effectiveness of the shielding tabs depends on the location of the shielding tabs when material is deposited, and continual monitoring of this location is important.

U.S. Pat. No. 5,456,756 to Ramaswami et al. and U.S. Pat. No. 5,614,446 to Ramaswami et al. describes the use of shielding tabs on the clamp ring used to hold wafers in place during material deposition to shield the alignment marks during material deposition. This shielding prevents material from being deposited over the alignment marks and obscuring the alignment marks.

U.S. Pat. No. 5,320,728 to Tepman describes a planar magnetron sputtering source used to produce a uniform coating of material during material deposition on a wafer.

SUMMARY OF THE INVENTION

FIG. 1 shows a top view of an integrated circuit wafer 10 having two alignment marks 12 and an alignment notch 14. FIG. 2 shows a top view of a clamping ring 16 used to hold the wafer in place during material deposition. FIG. 2 shows the shielding tabs 18 which prevent material from being deposited on the alignment marks. FIG. 3 shows the clamping ring 16 assembled in place with the wafer 10. The shielding tabs are located directly over the alignment marks on the wafer and prevent material from being deposited on the alignment marks.

The shielding tabs are an effective means to preserve the alignment marks during material deposition steps but problems can arise if the clamping ring is not properly aligned to the wafer so that the shielding tabs are not properly aligned to the alignment marks. This can be a particular problem when robotic equipment is used to align the clamping ring to the wafer. Many wafers can be processed before the problem is detected.

It is a principle objective of this invention to provide a method of monitoring the alignment of the shielding tabs to the alignment marks.

This objective is achieved using a monitor wafer, which is an oxide wafer having monitor marks formed thereon. The monitor wafer has the same size and shape as the product wafers and the monitor marks are located so that the centers of the monitor marks are in the same position on the oxide wafer as the centers of the alignment marks on the product wafers. The monitor marks are configured so that the distance from the center of the monitor marks can be readily determined by means of visual observation without the use of measuring equipment.

Periodically, such as after a fixed number of product wafers or after preventive maintenance on the equipment, an oxide wafer is processed through the step of material deposition. The same processing steps and equipment used for the product wafers are used for the oxide wafer. After the clamping ring is removed the monitor marks are observed to determine the shortest distance between the center of the monitor marks and the edge of the deposited material. If this distance is greater than a critical distance processing of product wafers continues. If the distance is not greater than a critical distance corrective action must be taken.

BRIEF DESCRIPTION OF THE DRAWINGS

FIG. 1 shows a top view of a product wafer showing an alignment notch and alignment marks.

FIG. 2 shows a top view of a clamping ring with shielding tabs.

FIG. 3 shows a top view of a clamping ring assembled with a product wafer.

FIG. 4A shows a top view of a monitor wafer showing monitor marks.

DESCRIPTION OF THE PREFERRED EMBODIMENTS

Figure 4B:
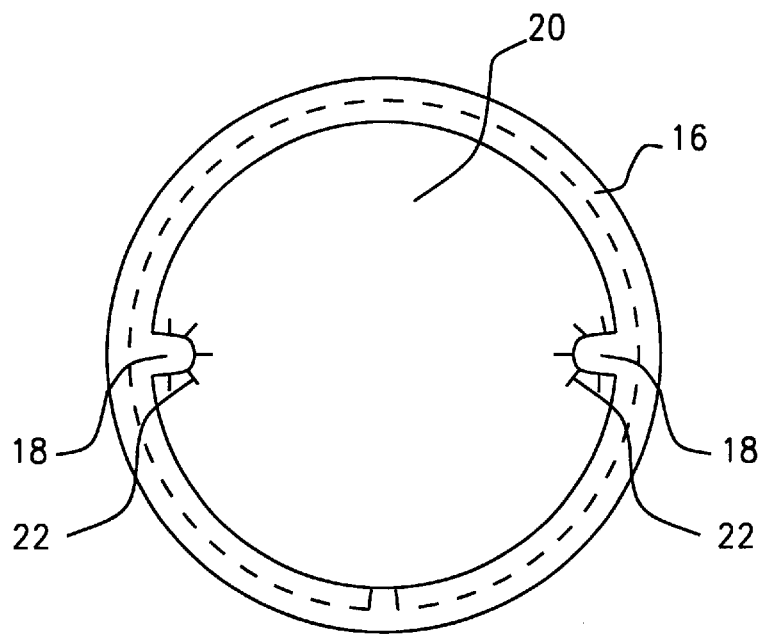
FIG. 4B shows a top view of a clamping ring assembled with a monitor wafer.

Refer now to the FIGS. 1–9 for a detailed description of the preferred embodiment of this invention. FIG. 1 shows a top view of a product wafer 10 having alignment marks 12 and an alignment notch 14. FIG. 2 shows a top view of a clamping ring 16 used to hold a wafer in place during deposition of a material, such as a conductor or a dielectric, on the wafer. The clamping ring 16 has shielding tabs 18 which are positioned to fit over the alignment marks on a product wafer and thereby prevent the deposition of the material over the alignment marks. FIG. 3 shows the clamping ring 16 and a product wafer 10 assembled together with the shielding tabs 18 covering the alignment marks.

FIG. 4A shows a top view of an oxide wafer 20, used as a monitor wafer, having monitor marks 22 formed thereon. The oxide wafer 20 has the same size and shape as a product wafer and also has the alignment notch 24. The monitor marks 22, two monitor marks in this example, are larger than the alignment marks on the product wafer but the center of the monitor marks are at the same location on the oxide wafer as the center of the alignment marks on the product wafer. In this example the alignment marks have the shape of a star. FIG. 4B shows a top view of the clamping ring 16 assembled to the oxide wafer 20, showing that each shielding tab covers most, but not all, of one of the monitor marks.

Figure 5:
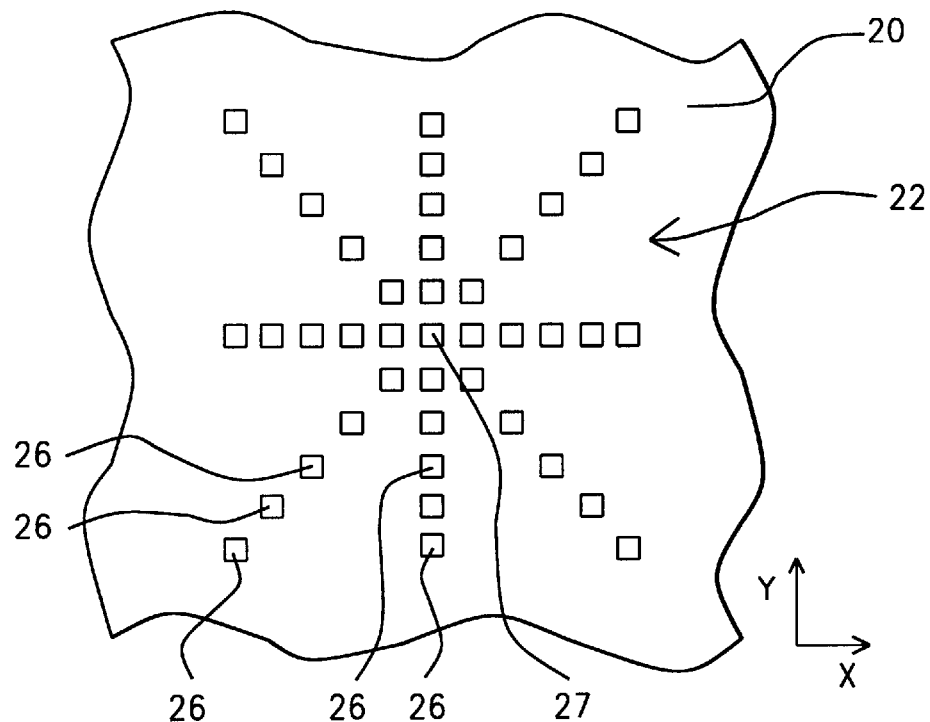
FIG. 5 shows an expanded view of one of the monitor marks.
Figure 6:
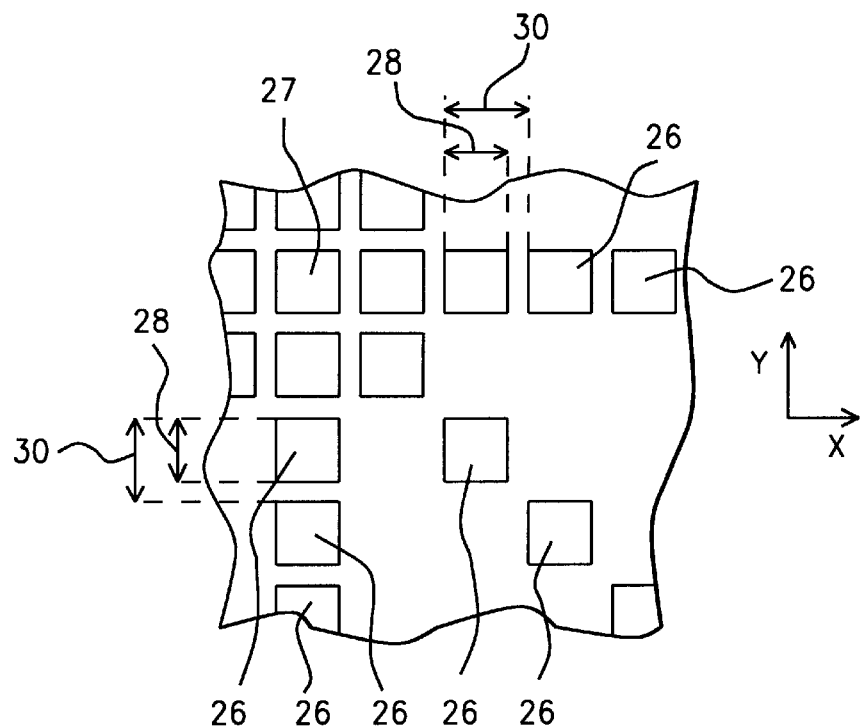
FIG. 6 shows the detail of a monitor mark.

FIG. 5 shows a detailed view of one of the monitor marks 22 formed on the oxide wafer 20. The monitor mark has a number of monitor squares 26 arranged in a star pattern around a center square 27. As shown in FIG. 5 the monitor squares 26 are located on a line in the X direction, a line in the Y direction which is orthogonal to the X direction, a line rotated 45° counter clockwise from the X direction, and a line rotated 45° clockwise from the X directions. The center square 27 and the monitor squares 26 have the same size and shape. FIG. 6 shows a detail view of the size of the squares and the distance between adjacent squares. As shown in FIG. 6, the length of the sides 28 of each of the squares has a first length, in this example about 0.536 millimeters. As shown in FIG. 6 the squares on the line in the X direction and the squares on the line in the Y direction have a pitch 30 of a second length, in this example about 0.7 millimeters.

Figure 7:
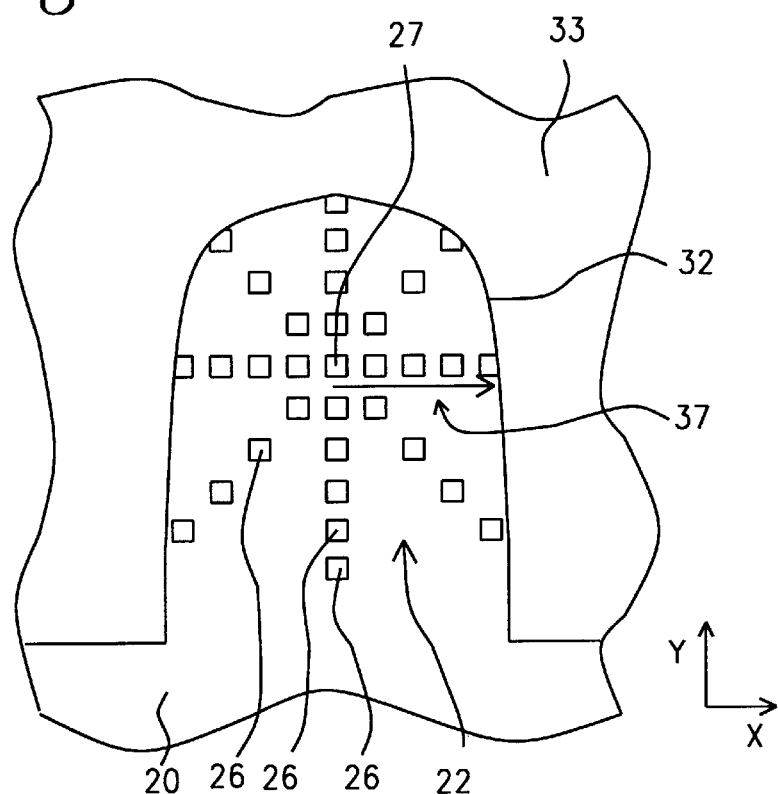
FIG. 7 shows a monitor mark on a monitor wafer after deposition of an opaque material for the case where there is good alignment between the monitor mark and the shielding tabs.
Figure 8:
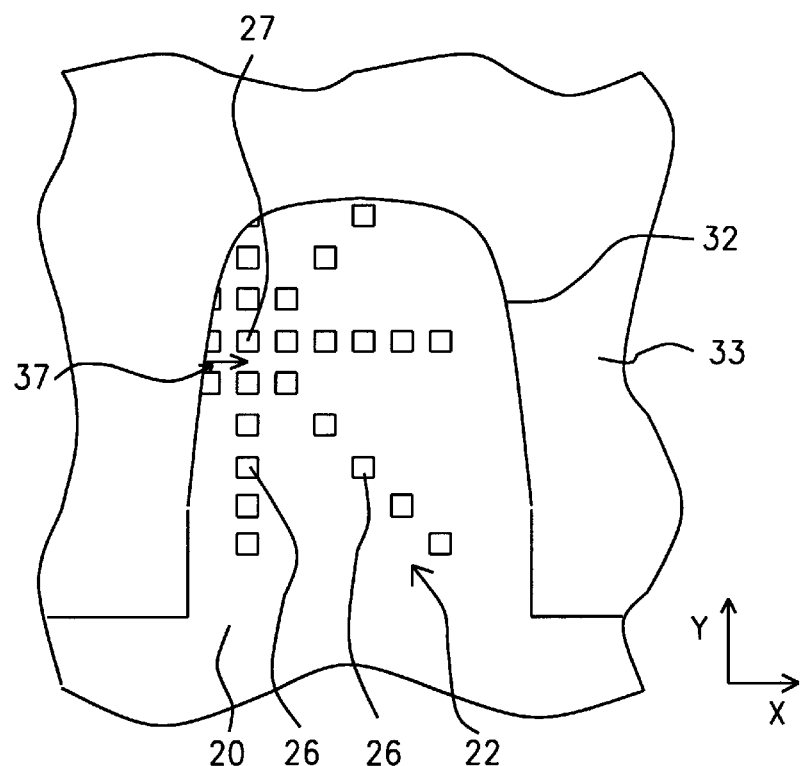
FIG. 8 shows a monitor mark on a monitor wafer after deposition of an opaque material for the case where there is good alignment between the monitor mark and the shielding tabs in the Y direction but poor alignment between the monitor mark and the shielding tabs in the X direction.
Figure 9:
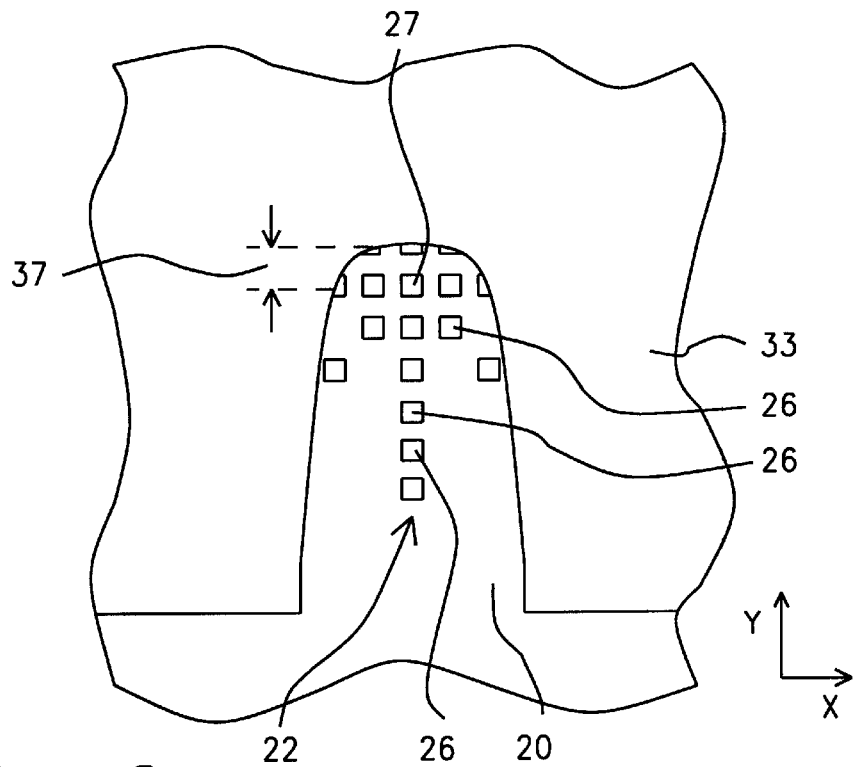
FIG. 9 shows a monitor mark on a monitor wafer after deposition of an opaque material for the case where there is good alignment between the monitor mark and the shielding tabs in the X direction but poor alignment between the monitor mark and the shielding tabs in the Y direction.

FIGS. 7–9 show top views of a part of an oxide monitor wafer 20 after a layer of material 33, in this example an opaque material such as a metal, has been deposited on the oxide monitor wafer 20 and the clamp ring has been removed. FIGS. 7–9 show the edge 32 of the deposited material 33 and the part of the monitor mark 22 which has not been covered by the deposited material 33. FIG. 7 shows an example where the center square 27 of the monitor mark is well centered in the space protected by the shielding tabs of the clamp ring as can be seen by observing the monitor squares 26 around the center square 27. The monitor squares 26 surrounding the center square 27 can be used to determine the minimum distance 37 to the edge 32 of the deposited material 33. If the minimum distance 37 is greater than a critical distance, in this example about 1.0 millimeters, the location of the shielding tabs in relation to the oxide monitor wafer is acceptable and the processing of product wafers can continue. If the minimum distance 37 is less than or equal to the critical distance, in this example about 1.0 millimeters, the location of the shielding tabs in relation to the oxide monitor wafer is not acceptable and corrective action must be taken before the processing of product wafers is continued.

FIG. 8 shows an example where the center square 27 of the monitor mark is not well centered in the space protected by the shielding tabs of the clamp ring as can be seen by observing the monitor squares 26 around the center square 27. In the example shown in FIG. 8, the center square 27 is well centered in the Y direction but not in the X direction. The monitor squares 26 surrounding the center square 27 can be used to determine the minimum distance 37 to the edge 32 of the deposited material 33. If the minimum distance 37 is greater than a critical distance, in this example about 1.0 millimeters, the location of the shielding tabs in relation to the oxide monitor wafer is acceptable and the processing of product wafers can continue. If the minimum distance 37 is less than or equal to the critical distance, in this example about 1.0 millimeters, the location of the shielding tabs in relation to the oxide monitor wafer is not acceptable and corrective action must be taken before the processing of product wafers is continued. In the example of FIG. 8 corrective action must be taken before the processing of product wafers is continued.

FIG. 9 shows an example where the center square 27 of the monitor mark is not well centered in the space protected by the shielding tabs of the clamp ring as can be seen by observing the monitor squares 26 around the center square 27. In the example shown in FIG. 9, the center square 27 is well centered in the X direction but not in the Y direction. The monitor squares 26 surrounding the center square 27 can be used to determine the minimum distance 37 to the edge 32 of the deposited material 33. If the minimum distance 37 is greater than a critical distance, in this example about 1.0 millimeters, the location of the shielding tabs in relation to the oxide monitor wafer is acceptable and the processing of product wafers can continue. If the minimum distance 37 is less than or equal to the critical distance, in this example about 1.0 millimeters, the location of the shielding tabs in relation to the oxide monitor wafer is not acceptable and corrective action must be taken before the processing of product wafers is continued. In the example of FIG. 9 corrective action must be taken before the processing of product wafers is continued.

Figure 10:
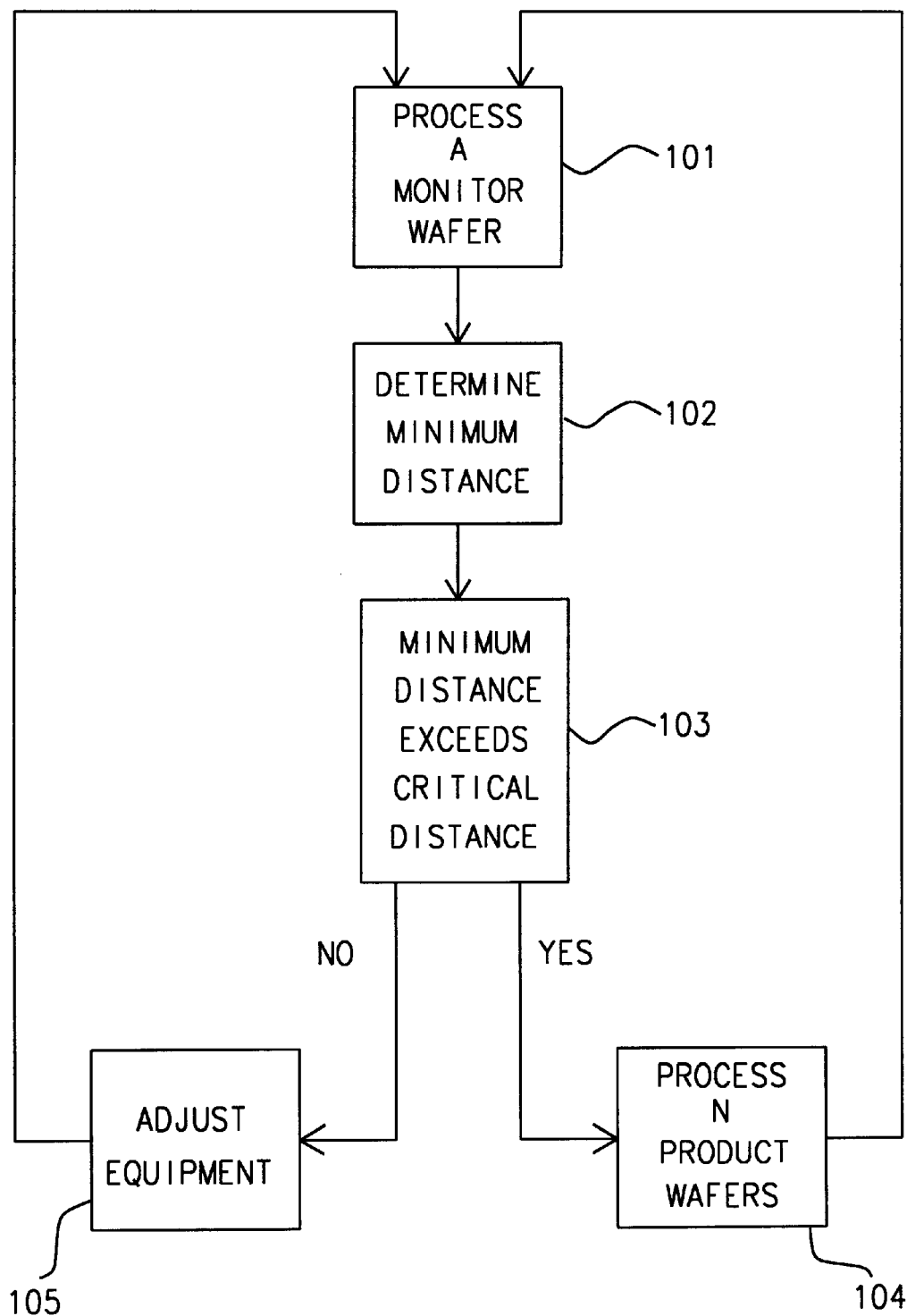
FIG. 10 shows a block diagram of the method used to monitor the shielding of alignment marks of production wafers using an oxide monitor wafer having monitor marks.

The processing of the oxide or monitor wafer is the same as the product wafers. The oxide monitor wafers are processed after changes to or maintenance of the processing equipment to assure proper operation before processing product wafers. The monitor wafers can also be used as a process control as shown by the block diagram in FIG. 10. As shown in the first block 101 of FIG. 10 a monitor wafer is processed exactly as the product wafers. Next, as shown in the second block 102, the minimum distance between the center square of the monitor mark and the edge of the deposited material is determined. Next, as shown in the third block 103, the minimum distance is compared to the critical distance. If the minimum distance exceeds the critical distance, as shown in the fourth block 104, a number of product wafers are processed, in this example about one thousand product wafers, and another monitor wafer is processed. If the minimum distance does not exceed the critical distance, as shown in the fifth block 105, the equipment must be adjusted and another monitor wafer processed before processing product wafers.

While the invention has been particularly shown and described with reference to the preferred embodiments thereof, it will be understood by those skilled in the art that various changes in form and details may be made without departing from the spirit and scope of the invention.

What is claimed is:

1. A method of monitoring the shielding of alignment marks; comprising:

providing product wafers wherein each of said product wafers has alignment marks and each said alignment mark has a center;

providing a clamp ring having shielding tabs wherein said clamp ring holds said product wafers in place during processing steps comprising material deposition on said product wafers so that said shielding tabs cover said alignment marks on said product wafers;

providing oxide wafers having the same size and shape as said product wafers;

forming monitor marks on each of said oxide wafers, wherein each of said monitor marks has a center and said centers of said monitor marks have the same location on said oxide wafers as said centers of said alignment marks on said production wafers;

selecting a material for deposition;

selecting a first said oxide wafer from said oxide wafers;

placing said clamp ring on said first oxide wafer so that said shielding tabs cover part or all of said monitor marks on said first oxide wafer;

depositing a layer of said selected material on said first oxide wafer after said clamp ring has been placed on said first oxide wafer;

removing said clamp ring from said first oxide wafer after depositing said layer of said selected material on said first oxide wafer thereby forming an edge of said layer of said selected material deposited on said first oxide wafer;

determining a first distance wherein said first distance is the smallest distance between said centers of said monitor marks on said first oxide wafer and said edge of said layer of said selected material deposited on said first oxide wafer;

depositing a layer of said selected material on said product wafers if said first distance is greater than a critical distance; and taking corrective action if said first distance is less than or equal to said critical distance.

2. The method of claim 1 wherein each of said monitor marks comprise a number of squares, the centers of said squares lie on four lines passing through said center of said monitor mark, and each of said lines intersect one of the other of said lines at an angle of 90° and two of the other of said lines at an angle of 45°.

3. The method of claim 1 wherein each of said monitor marks comprise a number of squares having sides of about 0.536 millimeters long.

4. The method of claim 1 wherein each of said monitor marks comprise a number of squares having centers which lie on a line with a pitch of about 0.7 millimeters.

5. The method of claim 1 wherein said critical distance is between about 0.9 and 1.1 millimeter.

6. The method of claim 1 wherein said layer of said selected material is opaque.

7. The method of claim 1 wherein said monitor marks are formed so that said first distance can be determined by direct observation of said monitor marks and said edge of said layer of said selected material.

8. The method of claim 1 wherein said first oxide wafer is subjected to the same processing steps prior to said deposition of said layer of said selected material on said first oxide wafer as said product wafers prior to said deposition of said layer of said selected material on said product wafers.

9. The method of claim 1 further comprising:

providing processing equipment for processing product wafers;

making changes to said processing equipment;

selecting a second said oxide wafer from said oxide wafers after making adjustments to or performing maintenance on said processing equipment;

placing said clamp ring on said second oxide wafer so that said shielding tabs cover part or all of said monitor marks on said second oxide wafer;

depositing a layer of said selected material on said second oxide wafer after said clamp ring has been placed on said second oxide wafer;

removing said clamp ring from said second oxide wafer after depositing said layer of said selected material on said second oxide wafer thereby forming an edge of said layer of said selected material deposited on said second oxide wafer;

determining a second distance wherein said second distance is the smallest distance between said centers of said monitor marks on said second oxide wafer and said edge of said selected material deposited on said second oxide wafer;

depositing a layer of said selected material on said product wafers if said second distance is greater than said critical distance; and taking corrective action if said second distance is less than or equal to said critical distance.

10. The method of claim 1 further comprising:

depositing a layer of said selected material on a first number of said product wafers;

selecting a third said oxide wafer from said oxide wafers after said layer of said selected material has been deposited on said first number of said product wafers;

placing said clamp ring on said third oxide wafer so that said shielding tabs cover part or all of said monitor marks on said third oxide wafer;

depositing a layer of said selected material on said third oxide wafer after said clamp ring has been placed on said third oxide wafer;

removing said clamp ring from said third oxide wafer after depositing said layer of said selected material on said third oxide wafer thereby forming an edge of said layer of said selected material deposited on said third oxide wafer;

determining a third distance wherein said third distance is the smallest distance between said centers of said monitor marks on said third oxide wafer and said edge of said layer of said selected material deposited on said third oxide wafer;

depositing a layer of said selected material on a second number of said product wafers if said third distance is greater than said critical distance; and taking corrective action if said third distance is less than or equal to said critical distance.

11. The method of claim 10 wherein said first number is about one thousand.

12. A method of monitoring the shielding of alignment marks; comprising:

providing product wafers wherein each of said product wafers has alignment marks and each said alignment mark has a center;

providing clamp rings wherein said clamp rings are identical and each of said clamp rings has shielding tabs;

placing one of said clamp rings on each of a first number of said product wafers wherein said alignment marks of each of said wafers are covered by said shielding tabs of said clamp ring placed on that wafer;

depositing a layer of a selected material on said first number of product wafers after placing said clamp rings on said first number of product wafers;

providing an oxide wafer, having the same size and shape as said product wafers, wherein said oxide wafer has monitor marks formed thereon, each of said monitor marks has a center, and said centers of said monitor marks have the same location on said oxide wafer as said centers of said alignment marks on said production wafers;

placing one of said clamp rings on said oxide wafer depositing a layer of said selected material on said oxide wafer after placing said clamp ring on said oxide wafer;

removing said clamp from said oxide wafer after depositing said layer of said selected material on said oxide wafer thereby forming an edge of said layer of said selected material deposited on said oxide wafer;

determining a first distance wherein said first distance is the smallest distance between said centers of said monitor marks on said oxide wafer and said edge of said layer of said selected material;

depositing a layer of said selected material on a second number of said product wafers if said first distance is greater than a critical distance; and taking corrective action if said first distance is less than or equal to said critical distance.

13. The method of claim 12 wherein each of said monitor marks comprise a number of squares, the centers of said squares lie on four lines passing through said center of said monitor mark, and each of said lines intersect one of the other of said lines at an angle of 90° and two of the other of said lines at an angle of 45°.

14. The method of claim 12 wherein each of said monitor marks comprise a number of squares having sides of about 0.536 millimeters long.

15. The method of claim 12 wherein each of said monitor marks comprise a number of squares having centers which lie on a line with a pitch of about 0.7 millimeters.

16. The method of claim 12 wherein said critical distance is between about 0.9 and 1.1 millimeter.

17. The method of claim 12 wherein said selected material is opaque.

18. The method of claim 12 wherein said monitor marks are formed so that said first distance can be determined by direct observation of said monitor marks and said edge of said layer of said selected material deposited on said oxide wafer.

19. The method of claim 12 wherein said oxide wafer is subjected to the same processing steps prior to said deposition of said layer of said selected material as said product wafers prior to said deposition of said layer of said selected material on said product wafers.

20. The method of claim 12 wherein said first number is about one thousand.

* * * * *